United States Patent [19]

Latasiewicz et al.

[11] Patent Number: 4,459,640
[45] Date of Patent: Jul. 10, 1984

[54] DISPLAY MOUNTING ASSEMBLY

[75] Inventors: Leonard Latasiewicz, Hoffman Estates; Bay E. Estes, III, Palatine, both of Ill.

[73] Assignee: Motorola Inc., Schaumburg, Ill.

[21] Appl. No.: 496,785

[22] Filed: May 20, 1983

Related U.S. Application Data

[63] Continuation of Ser. No. 263,530, May 14, 1981, abandoned.

[51] Int. Cl.³ .............................................. H05K 1/18
[52] U.S. Cl. ..................................... 361/395; 313/519; 340/719; 361/398; 361/399
[58] Field of Search ................. 361/346, 380, 390–395, 361/398, 399, 405, 408, 415, 429

[56] References Cited

U.S. PATENT DOCUMENTS

| | | | |
|---|---|---|---|
| 3,831,063 | 8/1974 | Keough | 361/408 |
| 4,092,698 | 5/1978 | Brefka | 361/399 |
| 4,181,964 | 1/1980 | Moore et al. | 361/399 X |
| 4,245,274 | 1/1981 | MacDonald | 361/399 |
| 4,286,457 | 10/1981 | Hahlganss | 361/398 X |

FOREIGN PATENT DOCUMENTS

52-38834 3/1977 Japan ................................. 361/399

Primary Examiner—R. R. Kucia
Attorney, Agent, or Firm—James W. Gillman; James S. Pristelski; Phillip H. Melamed

[57] ABSTRACT

A visual display mounting assembly is provided wherein a substantially rectangular parallelopiped central body 18 of a display module 17 is sandwiched between a planar surface 29 of a printed circuit board 23 and a substantially planar chassis wall 15 having a rectangular opening 16 therein for a front viewing surface 19 of the display module. The chassis wall opening 16 is formed with two opposing planar edge portions 32 of the chassis wall and two opposing nonplanar edge portions 33 of the wall comprising bent portions of the wall projecting towards the module. Peripheral portions 34 of the front surface 19 of the display module are positioned in pressure contact with the planar edge portions 32, and the front surface 19 is positioned between the non-planar edge portions 33 of the chassis wall. The display module 17 is held in place by retaining twist tabs 24 fixing the circuit board to the chassis wall and thereby having the circuit board press the display module body against the chassis wall.

18 Claims, 6 Drawing Figures

DISPLAY MOUNTING ASSEMBLY

This is a continuation of application Ser. No. 263,530, filed May 14, 1981 now abandoned.

BACKGROUND OF THE INVENTION

The present invention relates generally to the field of display module mounting assemblies wherein a visual display module is mounted to a chassis or housing. More particularly, the present invention relates to a mounting assembly for an electrically controlled visual display module having a plurality of electrical leads arranged in a linear array and extending from an end surface of the display module.

In mounting visual display modules to a chassis, care must be taken not to obstruct the front surface of the display module, which surface provides the desired displays, by the mounting structure used to affix the display module to a chassis or housing. In addition, it is desirable to mount the display module as close as possible to a viewing opening contained in the chassis or housing such that the front surface of the module can be readily viewed throughout a large viewing angle.

Electrically controlled visual diplay modules provide selective displays in response to received electrical signals, and therefore these modules modules must be electrically connected to additional electrical components which provide the control signals for the module. The least expensive way of accomplishing this electrical connection is to utilize a printed circuit board and solder the electrical control leads of the module to the circuit board, then the combined circuit board and display module are mechanically mounted to the chassis or housing.

When the display module comprises a central body having extending electrical leads arranged in two parallel linear arrays such that the module resembles a "dual in-line" integrated circuit package, it is customary to mount the module on a carrier printed circuit board which is then positioned at a predetermined distance away from a chassis wall having a viewing opening. Various techniques have been utilized to ensure the proper positioning of the display module with respect to the chassis wall opening, and one such technique is described in copending U.S. patent application Ser. No. 136,010, filed Mar. 31, 1980 entitled, "Method and Apparatus for Movable Printed Circuit Board Display" which is assigned to the same assignee as the present invention, now U.S. Pat. No. 4,316,235. This application illustrates a complex parallelogram structure for the mounting of a printed circuit board carrying a display module, and is used to ensure that the display module front viewing surface will be positioned parallel to a planar clear plastic protective covering fixed to a surrounding chassis which protects the display module. This technique, while feasible for display modules having electrical leads in a dual in-line configuration, is still rather complex and costly, and does not lend itself for utilization if the display module electrical leads extend from only a single end surface of a central body of the display module.

In mounting assemblies utilized prior to the present invention, vacuum fluorescent displays, also known as "bottle" displays, have been used as visual display modules. Some prior mounting assemblies have utilized such bottle display modules having only a single linear array of electrical leads, and in such cases the central body portion of the display modules has been provided with an integral projection. A retaining clip which snaps into a printed circuit board has been utilized to grasp this integral projection and maintain the central body of the display module mechanically fixed to a carrier printed circuit board. This type of prior art assembly requires the additional expense of a mounting clip which is snapped into the carrier printed circuit board, and also requires that the central body of the bottle display have an integral retaining projection which does not interfere with the front viewing surface of the display. Typically, this prior art assembly comprises inserting the electrical leads of the bottle display module into holes in a printed circuit board, wrapping the electrical leads of the bottle display around an edge of the circuit board, and snapping in a retainer clip into the circuit board which grasps the integral projection of the bottle display and thereby maintains the bottle display in a fixed position on the circuit board. If the bottle display has no such integral retaining projection, the use of this assembly is impractical since the retaining clip would then presumably contact a portion of the front viewing surface of the module and thereby obscure some of this surface while also requiring the front viewing surface to be spaced back from viewing openings contained in an external chassis for the module since clearance space for the retaining clip must then be provided

SUMMARY OF THE INVENTION

An object of the present invention is to provide an improved display module mounting assembly which overcomes the aforementioned deficiencies of prior display module mounting assemblies.

A more particular object of the present invention is to provide an improved visual display module mounting assembly usable with a vacuum fluorescent display module having only a single linear array of electrical control leads wherein the display module can be mounted without the use of a separate retaining clip and wherein the display module is not required to have a central body with an integral projection which can be grasped by a separate retaining clip.

In one embodiment of the present invention, a display module mounting assembly is provided, comprising: a visual display module having a central body shaped substantially as a polyhedron (preferably a parallelopiped) with front and rear substantially planar parallel external surfaces and having a plurality of electrical leads extending from said central body (preferably from an end surface thereof), selective visual displays being visible by viewing said front external surface; a substantially planar circuit board having conductive patterns thereon, said visual display module mechanically mounted to said circuit board with the electrical leads of said display module electrically connected to said circuit board pattern; a chassis having retaining means for fixing said circuit board and display module to said chassis, said chassis having a planar wall with an effective planar opening therein, and said display module mounted to said chassis such that a substantial portion of said front surface of said display module is visible through said chassis wall opening; said chassis wall forming said opening (which preferably is rectangular) with two opposing planar edge portions of said wall and two opposing non-planar edge portions of said wall, said non-planar edge portions comprising planar edge portions bent out of the plane of said wall and projecting towards said display module, said display module rear surface in substantially planar contact with said circuit board, and peripheral portions of said central body (preferably peripheral portions of front surface of said display module) positioned in contact with said planar edge portions of said wall with said front surface positioned between said non-planar edge portions of said wall.

Basically, a display module having a central body shaped substantially as a rectangular parallelopiped is positioned with respect to a chassis wall by inserting the electrical leads of the module, which are arranged in a single linear array, into associated holes in a printed circuit board. After soldering the electrical leads to conductive metallizations on the printed circuit board, the electrical leads are wrapped around an edge of the circuit board by rotating the display module central body through approximately 270 degrees. This results in positioning a planar rear surface of the display module substantially flush against a planar surface of the circuit board. Twist tab projections from the chassis wall extend upward and cooperate with openings in the printed circuit board to fix the circuit board and display module to the chassis wall such that an effective sandwich structure is produced with the display module central body being sandwiched between a planar chassis wall and the plane of the printed circuit board. The central body of the display module is fixed in its position to the chassis wall by having peripheral portions of the front surface of the central body vontact opposing planar edge portions of the chassis wall which partially form a substantially rectangular viewing opening in the chassis wall. Two opposing non-planar edge portions of the chassis wall aid in defining the viewing opening and comprise bent planar edge portions of the wall that project towards the display module and assist in determining the lateral position of the display module body.

The linear array of electrical leads of the display module are arranged substantially parallel to the opposing non-planar edges of the chassis wall and thereby substantially fix one lateral position of the display module while the non-planar formed edges of the chassis wall function as guides for aiding in the positioning of the display module in a different orthogonal lateral direction. The retaining twist tab projections of the chassis wall are utilized to apply a mounting force which captures the display module between the circuit board and the chassis wall to thereby fix the position of the display module with respect to the chassis wall. Preferably the twist tabs comprise at least a pair of twist tabs positioned midway between two opposing peripheral edges of the front surface of the module and beyond a second set of opposing peripheral edges of the front surface to thereby provide a uniform captivating pressure to the circuit board with respect to mounting the display module to the chassis wall. Additionally, the circuit board is provided with conductive metallization patterns arranged adjacent to peripheral portions of the rear surface of the display module so as to form locating guides for the proper initial positioning of the display module on the surface of the printed circuit board which will contact the rear surface of the display module.

Through the utilization of the above noted structural limitations, the present invention has implemented a display module mounting assembly which is extremely simple and inexpensive and does not require the use of a separate mounting clip nor the use of an integral projection, on the display module body, which is intended for cooperation with mounting structure.

BRIEF DESCRIPTION OF THE DRAWINGS

For a more complete understanding of the invention reference should be made to the drawings, in which.

DESCRIPTION OF THE PREFERRED EMBODIMENT

Figure 1:
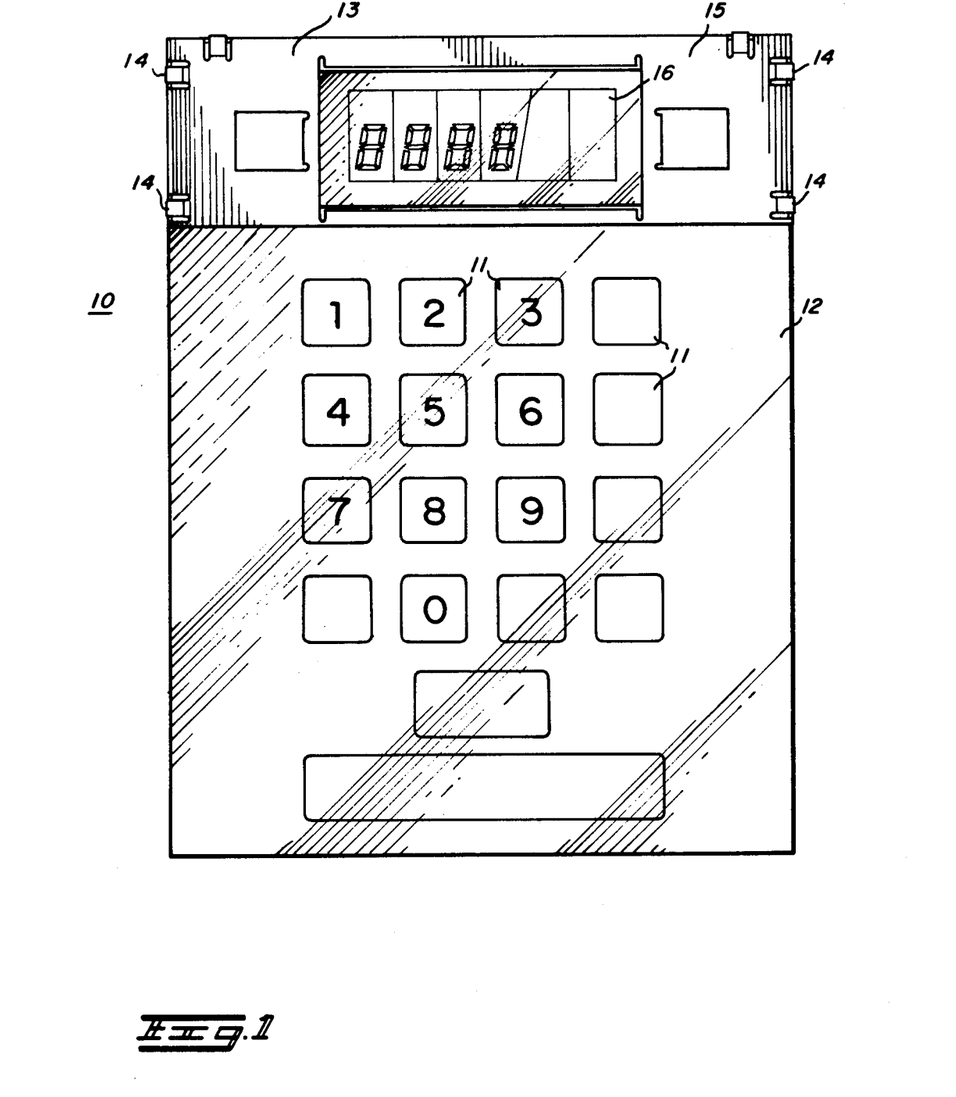
FIG. 1 is a planar view of a control panel of an electrical device having a visual display module mounting assembly embodying the present invention.

FIG. 1 illustrates a planar front view of a control panel 10 of an electrical device preferably comprising an electronically controlled cooking oven. The control panel includes a plurality of manually actuable pushbutton assemblies 11 associated with a cover plate 12 carrying identifying indicia associated with each of the pushbutton assemblies 11. The pushbutton assemblies 11 and cover plate 12 are mounted to a metal chassis 13 which is shown exposed at the top of the control panel 10. The exposed portion of the chassis 13 shown in FIG. 1 has four side retaining prongs 14 which aid in mounting a bezel (not shown) over this exposed portion for asthetic appearance purposes.

Figure 5:
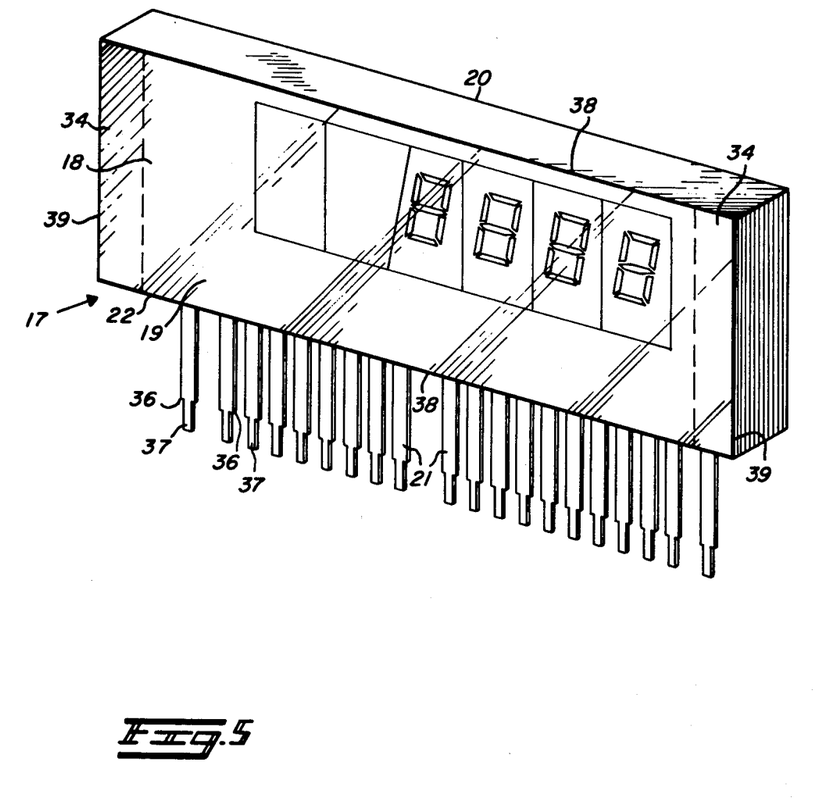
FIG. 5 is a planar view of the visual display module utilized in the assembly shown in FIG. 2.

As shown in FIG. 1, the chassis 13 comprises a chassis wall 15 which is substantially planar and has an effective central planar opening 16 therein which is substantially rectangular in shape. Behind the chassis wall 15 there is mounted a visual display module 17 which preferrably comprises a vacuum fluorescent display. Vacuum fluorescent displays are known and are commonly referred to as "bottle" displays. The structure of the bottle display module is best shown in FIG. 5. It should be noted that the bezel which fits over the exposed chassis 13 in FIG. 1 has a central viewing area which permits viewing the display module 17 through the opening 16.

The display module 17 comprises a central body 18 shaped substantially as a polyhedron (preferably a rectangular parallelopiped) with an external front substantially planar viewing surface 19 and a parallel substantially planar external rear surface 20. The display module 17 has a plurality of electrical leads 21 which are arranged in a linear array and extend outward from an end surface 22 of the display module 17. The display module 17 provides selective visual displays, which are visible by viewing the front external surface 19, in accordance with electrical signals received on the plurality of electrical leads 21.

The display module 17 is mechanically mounted to a printed circuit board 23 by the leads 21, and the circuit board 23 is attached to the metal chassis 13 by retaining means which comprise twist tab projections 24. Each of the twist tab projections 24 comprises an integral projection extending from the chassis wall 15. Each twist tab projection 24 has an end portion 25 which projects through an associated opening 26 in the printed circuit board 23 to fix the circuit board to the chassis 13 upon the twisting of the end portion 25. Mounting printed circuit boards to a chassis through the use of similar twist tab retaining projections is known in prior circuit board mounting assemblies. U.S. Pat. No. 4,076,165 shows details of the construction and use of the projections 24.

The printed circuit board 23 is substantially planar and has a number of electrical circuit components mounted on a first planar surface 27 thereof, also referred to as the component side, and a number of electrically conductive interconnecting metalization patterns 28 mounted on an opposite planar surface 29 thereof. The circuit board 23 has a plurality of through holes 30 arranged in a linear array and positioned adjacent and parallel to an edge 31 of the circuit board 23. Each of the plurality of electrical leads 21 of the visual display module 17 is received in an associated one of the through holes 30 in the printed circuit board 23, and the electrical leads 21 are electrically connected, preferably by solder, to the conductive metallization patterns 28 on the surface 29 of the circuit board. Preferably, each of the leads 21 of the visual display module 17 is wrapped around the edge 31 of the circuit board 23 thereby positioning the substantially planar rear surface 20 of the display module 17 substantially parallel and adjacent to and in contact with the planar surface 29 of the printed circuit board 23 with a majority of the surface area of the front viewing surface 19 being visible through the opening 16 in the chassis wall 15.

Figure 3:
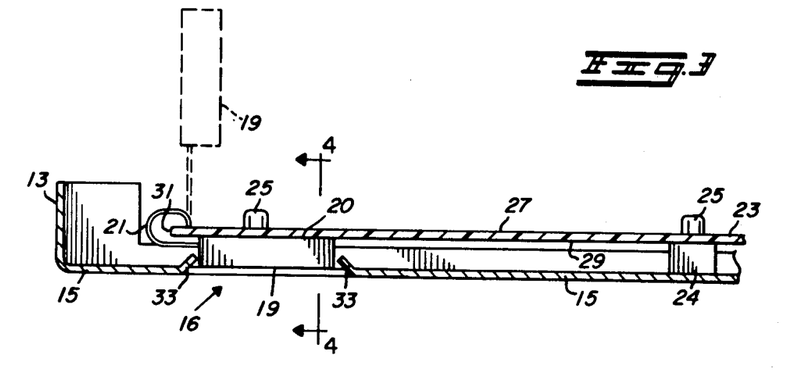
FIG. 3 is a cross-sectional view of the assembly shown in FIG. 2 taken along the lines 3—3.
Figure 4:
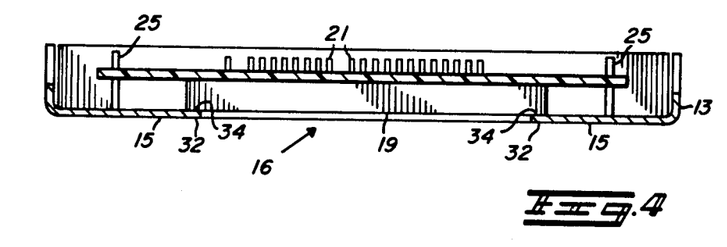
FIG. 4 is a cross-sectional view of the assembly shown in FIG. 2 taken along the lines 4-4.

The visual display module mounting assembly of the present invention is best illustrated in FIGS. 3 and 4 of the drawings which show the mounting assembly of the present invention in cross section. It should be noted that in both FIGS. 3 and 4 the central body 18 of the display module 17 has not been shown in cross section for the purposes of clarity since illustrating this element in cross section would not aid in understanding the present invention.

Referring to FIGS. 3 and 4 of the drawings, it can be seen that the substantially rectangular chassis wall opening 16 is formed by two opposing planar edge portions 32 of the chassis wall 15 and two opposing non-planar edge portions 33 of the chassis wall 15. The non-planar edge portions 33 comprise planar edge portions of the chassis wall 15 which have been formed and bent out of the plane of the chassis wall and project towards the display module 17 thereby forming positioning guide members for laterally positioning the central body 18 of the display module 17. The rear surface 20 of the display module 17 is in substantially planar contact with the circuit board surface 29 and peripheral portions 34 of the front viewing surface 19 of the display module are in contact with the planar edge portions 32 of the chassis wall with the front surface 19 being positioned between the non-planar edge portions 33 of the chassis wall 15. It is contemplated that peripheral portions of the central body 18 other than the peripheral portions 34 of the front surface 19 could be used to contact the planar edge portions 32, especially when these peripheral portions are parallel to the front and rear surfaces 19 and 20.

Figure 2:
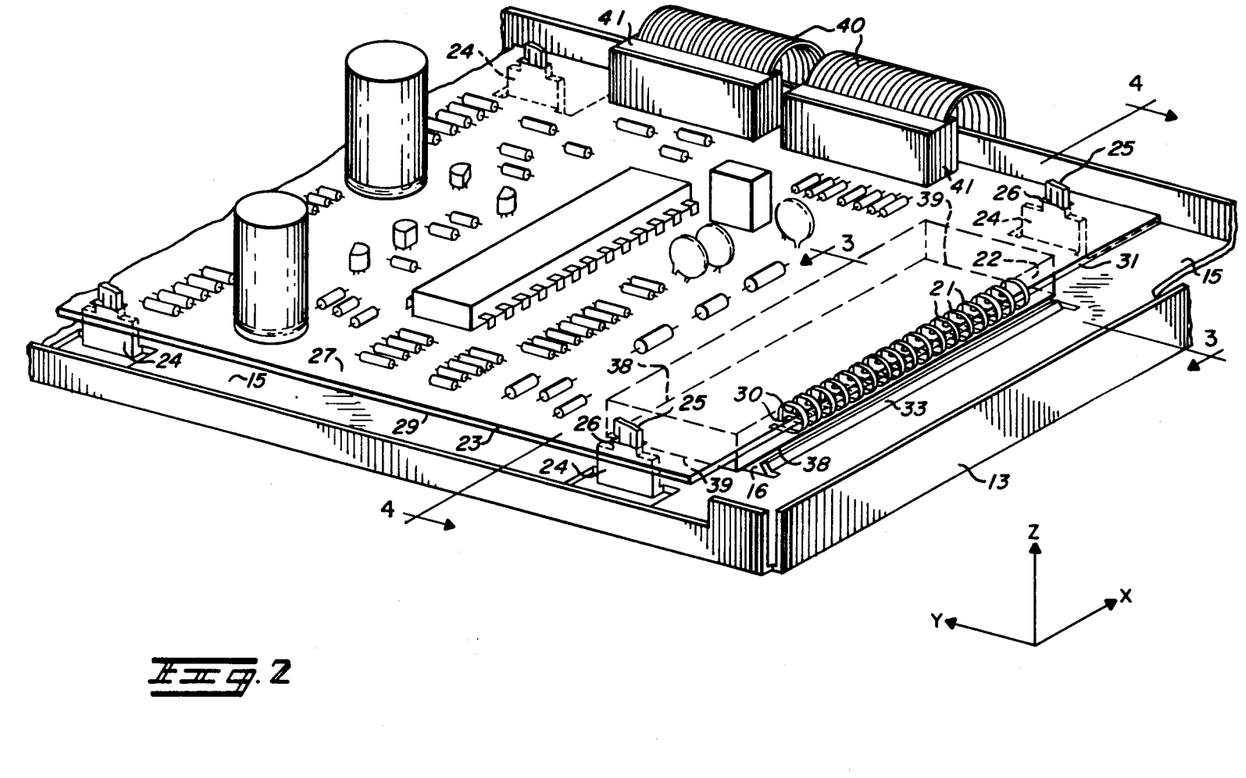
FIG. 2 is a perspective view of the display module mounting assembly of the present invention.
Figure 6:
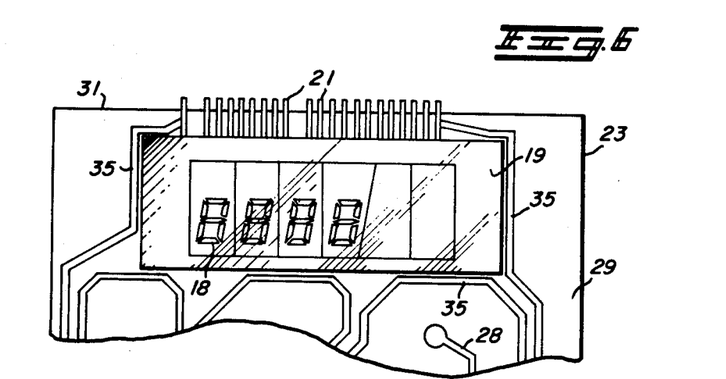
FIG. 6 is a planar view of a portion of the assembly shown in FIG. 2.

By virtue of the above-described structure, it can be seen that the non-planar edge portions 33 of the chassis wall 15 provide lateral locating guides for properly positioning, in the lateral direction Y in FIG. 2, the surface 19 of the display module 17 within the chassis wall opening 16. In addition, providing for direct contact of the peripheral portions 34 of the front viewing surface 19 by the planar edge portions 32 of the chassis wall permits a large viewing angle for displays provided by the module 17 while also insuring the proper location of the display module 17 in the direction Z with respect to the chassis wall 15. This is accomplished by positioning the front surface 19 as close as possible to the chassis wall 15. The electrical leads 21 provide for initial rough positioning of the display module central body 18 in the direction X as illustrated in FIG. 2. The leads 21 and holes 30 are arranged in a linear array parallel to the edge 31 and the non-planar edge portions 33. Additionally, it should be noted that the surface 29 of the printed circuit board 23 has conductive patterns 35 thereon (see FIG. 6) which are located adjacent to the periphery of the rear surface 20 of the display module. These patterns 35 assist in properly locating the central body 18 of the display module on the surface 29 of the printed circuit board by providing visual guidelines.

Preferably, the display module 17, along with other electrical components, is initially mounted on the surface 27 of the printed circuit board 23 with electrical leads extending through holes in the circuit board. Then the printed circuit board and assembled components, including the display module 17, are soldered to the conductive metallizations on the surface 29 of the circuit board, and preferably this is accomplished through wave soldering techniques. It should be noted that each of the electrical leads 21 of the display module has integrally formed spacing shoulders 36 and further extending end portions 37 (see FIG. 5). The further extending end portion 37 are received in the associated holes 30 in the circuit board with the spacing shoulders 36 abutting against and in contact with portions of the circuit board 23 surrounding the associated holes 30. This feature of the present invention provides for the initial proper positioning of the display module central body 18 above the plane of the printed circuit board 23 to avoid damage to the display module during the wave soldering process. After the soldering has been completed, it is contemplated that the display module will be rotated through substantially 270 degrees with respect to the plane of the printed circuit board while the electrical leads 21 are being wrapped about the edge 31 of the circuit board. This results in positioning the rear surface 20 of the display module substantially parallel to the surface 29 of the printed circuit board. FIG. 3 illustrates by dashed lines the position of the display module 17 prior to the wrapping around of the leads 21, while the position of the display module 17 after the wrapping around of the leads is shown by solid lines.

It is contemplated that by twisting the end portions 25 of the twist tab projections 24, a sandwich type structure will be provided wherein the central body 18 of the display module will be sandwiched between the substantially planar printed circuit board 23 and the substantially planar chassis wall 15. It is contemplated that by dimensioning of the end portions 25 and other elements of the assembly, pressure will be applied by the twist tab projections 24 to hold the display module 17 in place by forcing the printed circuit board 23 towards the chassis wall 15 and thereby pressing the display module central body 18 between the surface 29 and the edge portions 32 of the chassis wall 15. To ensure the application of a uniform pressure to hold the display module 17 in place, it has been found to be most advantageous to locate a pair of the twist tab projections 24 midway between a first set of opposing peripheral edges 38 of the front surface 19 of the module, while having each of the pair of twist tab projections being positioned beyond a second set of opposing peripheral edges 39 of the front surface 19 of the module. This has been found to provide a more uniform pressure for maintaining the display module 17 in position by providing a more uniform contact pressure for the peripheral portions 34 of the display front surface 19 and the edge portions 32 of the housing wall.

Although not part of the invention, it should be noted that FIG. 2 illustrates a pair of flat flexible printed circuit connections 40 which interconnect the pushbutton assemblies 11 on the front control panel to conductive metallizations on the printed circuit board 23. This interconnection is provided by cable connection plugs 41 mounted on the component side 27 of the printed circuit board 23.

Due to the above described structural features of the present invention, an inexpensive display module mounting assembly has been provided which utilizes a minmum number of mounting components, provides for accurately locating a display module with respect to a component chassis, and provides for a large viewing angle for the display module due to mounting the visible front surface of the display module in close proximity to the opening in the chassis through which the display module will be visible. While we have shown and described a specific embodiment of this invention, further modifications and improvements will occur to those skilled in the art. Such modifications could comprise using a polyhedron other than a rectangular parallelopiped and having the front external surface 19 protrude through the opening 16 but being laterally positioned between the non-planar edge portions 33. All such modifications which retain the basic underlying principles disclosed and claimed herein are within the scope of this invention.

We claim:

1. A display module mounting assembly comprising:
   a visual display module having a central body shaped substantially as a polyhedron with front and rear substantially planar parallel external surfaces and having a plurality of electrical leads extending from said central body, selective visual displays being visible by viewing said front external surface;
   a substantially planar circuit board having conductive patterns thereon, said visual display module mechanically mounted to said circuit board with the electrical leads of said display module electrically connected to said circuit board patterns;
   a chassis having retaining means for fixing said circuit board and display module to said chassis, said chassis having a planar wall with an effective planar opening therein and said display module mounted to said chassis such that a substantial portion of said front surface of said display module is visible through said chassis wall opening;
   said chassis wall forming said opening with two opposing planar edge portions of said wall and two opposing non-planar edge portions of said wall, said non-planar edge portions comprising planar edge portions bent out of the plane of said wall and projecting towards said display module, said display module rear surface in substantially planar contact with said circuit board, and peripheral portions of said central body of said display module positioned in contact with said planar edge portions of said wall with said front surface positioned between said non-planar edge portions of said wall.

2. A display module mounting assembly according to claim 1 wherein said retaining means fixing said circuit board and display module to said chassis comprise twist tab projections integral with said chassis which extend through associated openings in said circuit board and which, upon twisting of end portions thereof, fix said circuit board to said chassis.

3. A display module mounting assembly according to claim 2 wherein said twist tabs comprise extending projections from said planar chassis wall.

4. A display module mounting assembly according to claim 3 wherein a pair of said twist tabs is disposed substantially midway between a first set of opposing peripheral edges of said front surface of said module, each of said pair of twist tabs being positioned beyond a second set of opposing peripheral edges of said front surface substantially perpendicular to said first set of opposing peripheral edges, whereby said twist tabs are utilized to apply a uniform pressure to said circuit board for maintaining said display module between said chassis wall and circuit board.

5. A display module mounting assembly according to claim 1 wherein said display module electrical leads have end portions extending through associated holes in said circuit board which are located at an edge of said circuit board, said display module leads being wrapped around said edge of said circuit board thereby positioning said rear surface of said display module substantially parallel to the plane of said circuit board.

6. A display module mounting assembly according to claim 5 wherein said plurality of electrical leads of said display module and their associated circuit board holes are arranged in a substantially linear array in a direction parallel to the edge of said circuit board about which said leads are wrapped, said direction being substantially parallel to said non-planar formed edges of said chassis wall.

7. A display module mounting assembly according to claim 6 wherein said circuit board conductive patterns are provided on a surface of said circuit board adjacent to and in contact with said rear surface of said display module.

8. A display module mounting assembly according to claim 7 wherein some of said conductive patterns on said adjacent surface of said circuit board are arranged in patterns adjacent to peripheral portions of said rear surface, thereby forming locating guides for properly positioning said rear surface of said module with respect to said adjacent surface of said circuit board.

9. A display module mounting assembly comprising:
   a visual display module having a central body shaped substantially as a parallelopiped with front and rear substantially planar parallel external surfaces and having a plurality of electrical leads extending from an end surface thereof, selective visual displays being visible by viewing said front external surface;
   a substantially planar circuit board having conductive patterns thereon, said visual display module mechanically mounted to said circuit board with the electrical leads of said display module electrically connected to said circuit board patterns;
   a chassis having retaining means for fixing said circuit board and display module to said chassis, said chassis having a planar wall with an effective planar opening therein and said display module mounted to said chassis such that a substantial portion of said front surface of said display module is visible through said chassis wall opening;

said chassis wall opening being substantially rectangular and said chassis wall forming said opening with two opposing planar edge portions of said wall and two opposing non-planar edge portions of said wall, said non-planar edge portions comprising planar edge portions bent out of the plane of said wall and projecting towards said display module, said display module rear surface in substantially planar contact with said circuit board, and peripheral portions of said front surface of said display module positioned in contact with said planar edge portions of said wall with said front surface positioned between said non-planar edge portions of said wall.

10. A display module mounting assembly according to claim 1 wherein said electrical leads have integrally formed spacing shoulders with further extending end portions, said further extending end portions being received in associated holes in said circuit board with said spacing shoulders abutting against and in contact with portions of said circuit board surrounding said associated holes, whereby said spacing shoulders provide for proper initial positioning of the display module central body away from said circuit board.

11. A display module mounting assembly comprising:

a visual display module having a central body shaped substantially as a polyhedron with front and rear substantially planar parallel external surfaces and having a plurality of electrical leads extending from said central body, selective visual displays being visible by viewing said front external surface;

a substantially planar circuit board having conductive patterns thereon, said visual display module mechanically mounted to said circuit board with the electrical leads of said display module electrically connected to said circuit board pattern patterns;

a chassis having retaining means for fixing said circuit board and display module to said chassis, said chassis having a planar wall with an effective planar opening therein and said display module mounted to said chassis such that a substantial portion of said front surface of said display module is visible through said chassis wall opening;

said chassis wall forming said opening with two opposing planar edge portions of said wall and two opposing non-planar edge portions of said wall, said non-planar edge portions comprising planar edges having portions bent out of the plane of said wall, said display module rear surface coupled to and substantially parallel to said planar circuit board, and peripheral portions of said central body of said display module positioned substantially in contact with said planar edge portions of said wall with said central body positioned between said non-planar edge portions of said wall, wherein said retaining means comprises means for forcing said printed circuit board towards said chassis wall and thereby pressing said display module peripheral portions substantially into contact with said planar edge portions of said chassis wall, and wherein said bent planar edge portions generally project toward said printed circuit board.

12. A display module mounting assembly according to claim 11 wherein said retaining means fixing said circuit board and display module to said chassis comprise twist tab projections integral with said chassis which, upon twisting of end portions thereof, fix said circuit board to said chassis.

13. A display module mounting assembly according to claim 12 wherein said twist tabs comprise extending projections from said planar chassis wall.

14. A display module mounting assembly according to claim 13 wherein a pair of said twist tabs is disposed substantially midway between a first set of opposing peripheral edges of said front surface of said module, each of said pair of twist tabs being positioned beyond a second set of opposing peripheral edges of said front surface substantially perpendicular to said first set of opposing peripheral edges, whereby said twist tabs are utilized to apply a uniform pressure to said circuit board for maintaining said display module between said chassis wall and circuit board.

15. A display module mounting assembly according to claim 11 wherein said display module electrical leads have end portions extending through associated holes in said circuit board which are located at an edge of said circuit board, said display module leads being wrapped around said edge of said circuit board thereby positioning said rear surface of said display module substantially parallel to the plane of said circuit board.

16. A display module mounting assembly according to claim 15 wherein said plurality of electrical leads of said display module and their associated circuit board holes are arranged in a substantially linear array in a direction parallel to the edge of said circuit board about which said leads are wrapped, said direction being substantially parallel to said non-planar formed edges of said chassis wall.

17. A display module mounting assembly according to claim 16 which includes extending projections of said chassis which cooperate with openings in said printed circuit board to locate said board with respect to said chassis.

18. A display module mounting assembly according to claim 18 which includes extending projections of said chassis which cooperate with openings in said printed circuit board to locate said board with respect to said chassis.

* * * * *

UNITED STATES PATENT AND TRADEMARK OFFICE
CERTIFICATE OF CORRECTION

PATENT NO. : 4,459,640

DATED : July 10, 1984

INVENTOR(S) : Leonard Latasiewicz and Bay E. Estes, III

It is certified that error appears in the above-identified patent and that said Letters Patent is hereby corrected as shown below:

Col. 10, line 52, "18" should be --11--.

Signed and Sealed this

Seventeenth Day of September 1985

[SEAL]

Attest:

Attesting Officer

DONALD J. QUIGG

Commissioner of Patents and Trademarks—Designate